United States Patent
Ahn et al.

(10) Patent No.: US 8,451,037 B2
(45) Date of Patent: May 28, 2013

(54) DUTY CYCLE CORRECTION CIRCUIT

(75) Inventors: Seung-Joon Ahn, Gyeonggi-do (KR); Jong-Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 80 days.

(21) Appl. No.: 13/048,185

(22) Filed: Mar. 15, 2011

(65) Prior Publication Data

US 2012/0154006 A1   Jun. 21, 2012

(30) Foreign Application Priority Data

Dec. 17, 2010   (KR) .................. 10-2010-0129894

(51) Int. Cl.
*H03K 3/017*   (2006.01)
(52) U.S. Cl.
USPC ......................................... 327/175; 327/172
(58) Field of Classification Search
USPC .................................................. 327/172–175
See application file for complete search history.

(56) References Cited

U.S. PATENT DOCUMENTS

| 7,298,193 | B2* | 11/2007 | Agarwal et al. | 327/175 |
| 7,612,593 | B2* | 11/2009 | Kim et al. | 327/175 |
| 7,847,609 | B2* | 12/2010 | Shin | 327/175 |
| 7,915,939 | B2* | 3/2011 | Jang et al. | 327/175 |
| 8,207,772 | B2* | 6/2012 | Shin | 327/175 |
| 2009/0058481 | A1* | 3/2009 | Kim et al. | 327/175 |

FOREIGN PATENT DOCUMENTS

| KR | 1020050064241 | 6/2005 |
| KR | 1020100122673 | 11/2010 |

OTHER PUBLICATIONS

Office Action issued by the Korean Intellectual Property Office on Jun. 20, 2012.
Notice of Allowance issued by the Korean Intellectual Property Office on Nov. 14, 2012.

* cited by examiner

*Primary Examiner* — An Luu
(74) *Attorney, Agent, or Firm* — IP & T Group LLP

(57) ABSTRACT

A duty cycle correction circuit includes a duty cycle control unit configured to generate a corrected clock signal by correcting a duty cycle of an input clock signal in response to a control signal, a duty cycle detection unit configured to detect a duty cycle of the corrected clock signal and output a detection signal, and a control signal generation unit configured to generate the control signal in response to the detection signal.

23 Claims, 4 Drawing Sheets

DUTY CYCLE CORRECTION CIRCUIT

CROSS-REFERENCE TO RELATED APPLICATIONS

The present application claims priority of Korean Patent Application No. 10-2010-0129894, filed on Dec. 17, 2010, which is incorporated herein by reference in its entirety.

BACKGROUND OF THE INVENTION

Exemplary embodiments of the present invention relate to a technology for designing a semiconductor integrated circuit, and more particularly, to a duty cycle correction circuit (DCC) which corrects a duty cycle of a clock signal and outputs a clock signal with a corrected duty cycle.

In general, a semiconductor device including a Double Data Rate Synchronous Dynamic Random Access Memory (DDR SDRAM) includes diverse internal circuits for diverse operations, and among the internal circuits is a duty cycle correction circuit (DCC) which receives a clock signal and corrects the duty cycle of the clock signal to be a desired duty cycle. The duty cycle correction circuit may receive an internal clock signal outputted from a Delay Locked Loop (DLL) and a Phase Locked Loop (PLL) that are included in the inside of a semiconductor device and correct the duty cycle of the internal clock signal to be 50%. That is, the pulsing duration of the internal clock signal becomes half the period of the internal clock signal (50:50). The corrected internal clock signal having a duty cycle of 50:50 becomes a basis for a stable circuit operation of the semiconductor device.

Meanwhile, a duty cycle correction circuit generally occupies a relatively large circuit area and has a complicated structure, thereby consuming significant current. Therefore, a duty cycle correction circuit with a simple structure is useful.

SUMMARY OF THE INVENTION

An embodiment of the present invention is directed to a duty cycle correction circuit with a simple internal structure.

In accordance with an exemplary embodiment of the present invention, a duty cycle correction circuit includes: a duty cycle control unit configured to generate a corrected clock signal by correcting a duty cycle of an input clock signal in response to a control signal; a duty cycle detection unit configured to detect a duty cycle of the corrected clock signal and output a detection signal; and a control signal generation unit configured to generate the control signal in response to the detection signal.

In accordance with another exemplary embodiment of the present invention, a duty cycle detection circuit includes: a first pulse detection circuit configured to detect a first logic level of an input clock signal; a second pulse detection circuit configured to detect a second logic level of the input clock signal; and a detection signal output circuit configured to output a detection signal based on a duty cycle of the input clock signal after an output signal of the second pulse detection circuit is enabled.

The detection signal output circuit may include: an input block configured to receive an output signal of the first pulse detection circuit in response to the output signal of the second pulse detection circuit; a latching block configured to latch a signal transferred through the input block; and an output block configured to output an output signal of the latching block as the detection signal in response to the output signal of the second pulse detection circuit.

In accordance with yet another exemplary embodiment of the present invention, a duty cycle control circuit includes: a delay circuit configured to delay an input clock signal by a delay time and output a delayed signal; a clock signal output circuit configured to output a corrected clock signal in response to the input clock signal and an output clock signal of the delay circuit; and a control circuit configured to control a transition timing of the corrected clock signal in response to a control signal.

The control circuit may mix the input clock signal with the output clock signal of the delay circuit for the delay time of the delay circuit.

In accordance with still another exemplary embodiment of the present invention, a method for operating a duty cycle correction circuit includes: sequentially detecting a first logic level and a second logic level of an input clock signal which form one cycle of the input clock signal; and detecting a duty cycle of the input clock signal in response to a second detection signal corresponding to the second logic level.

The result value indicating the duty cycle of the input clock signal may be outputted after the second detection signal is enabled.

The duty cycle correction circuit in accordance with an embodiment of the present invention may have a fast circuit operation rate and minimize circuit area and current consumption by simplifying the internal structure.

DESCRIPTION OF SPECIFIC EMBODIMENTS

Figure 1:
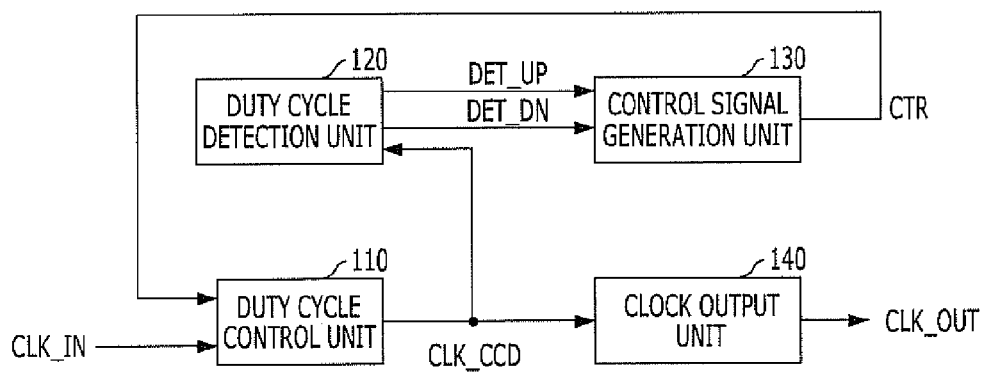
FIG. 1 is a block view illustrating a duty cycle correction circuit in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block view illustrating a duty cycle correction circuit in accordance with an embodiment of the present invention.

Referring to FIG. 1, the duty cycle correction circuit includes a duty cycle control unit 110, a duty cycle detection unit 120, a control signal generation unit 130, and a clock output unit 140.

The duty cycle control unit 110 receives a fed-back control signal CTR, corrects the duty cycle of an input clock signal CLK_IN, and outputs a corrected clock signal CLK_CCD. The corrected clock signal CLK_CCD of the initial stage of a circuit operation is almost the same as the input clock signal CLK_IN, which will be described later again, and after a duty cycle correction operation, the corrected clock signal CLK_CCD may have a duty cycle of 50:50.

The duty cycle detection unit 120 detects the duty cycle of the corrected clock signal CLK_CCD, which is an output signal of the duty cycle control unit 110, and outputs an up-detection signal DET_UP and a down detection signal DET_DN. In other words, either the up-detection signal DET_UP or the down detection signal DET_DN is enabled based on the duty cycle of the corrected clock signal CLK_CCD.

The control signal generation unit 130 generates the control signal CTR in response to the up-detection signal DET_UP and the down detection signal DET_DN. The generated control signal CTR is inputted to the duty cycle control unit 110. Subsequently, the duty cycle control unit 110 corrects the duty cycle of the input clock signal CLK_IN in response to the control signal CTR, and outputs the input clock signal CLK_IN with a corrected duty cycle as the corrected clock signal CLK_CCD. If the control signal generation unit 130 is designed as a counter which performs a counting operation in response to the up-detection signal DET_UP and the down detection signal DET_DN, the control signal CTR may be a code signal formed of a plurality of bits.

The clock output unit 140 generates an output clock signal CLK_OUT in response to the corrected clock signal CLK_CCD. Here, the corrected clock signal CLK_CCD has a duty cycle of 50:50 since the duty cycle correction operation is completed, and the output clock signal CLK_OUT comes to have the desired duty cycle as well.

Figure 2:
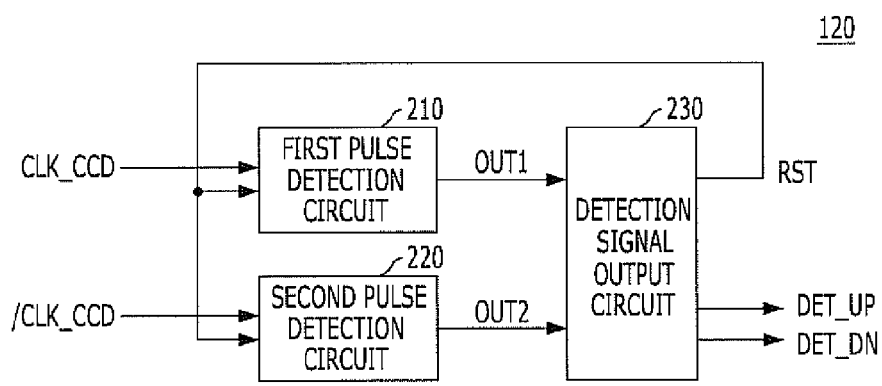
FIG. 2 is a block view illustrating a duty cycle detection unit 120 shown in FIG. 1.

FIG. 2 is a block view illustrating the duty cycle detection unit 120 shown in FIG. 1.

Referring to FIG. 2, the duty cycle detection unit 120 includes a first pulse detection circuit 210, a second pulse detection circuit 220, and a detection signal output circuit 230.

The first pulse detection circuit 210 is for detecting a logic 'high' duration of the corrected clock signal CLK_CCD. The first pulse detection circuit 210 receives the corrected clock signal CLK_CCD and generates a first output signal OUT1. The second pulse detection circuit 220 is for detecting a logic 'low' duration of the corrected clock signal CLK_CCD. The second pulse detection circuit 220 receives an inverted signal of the corrected clock signal, i.e., /CLK_CCD, and generates a second output signal OUT2. Subsequently, the detection signal output circuit 230 outputs the up-detection signal DET_UP and the down detection signal DET_DN which correspond to the duty cycle of the corrected clock signal CLK_CCD after the second output signal OUT2 is enabled. When the duty cycle of the corrected clock signal CLK_CCD is lower than 50% (for example, 40:60), the up detection signal DET_UP is enabled, and when the duty cycle of the corrected clock signal CLK_CCD is higher than 50% (for example, 60:40), the down detection signal DET_DN is enabled. This will be described again later.

Figure 3:
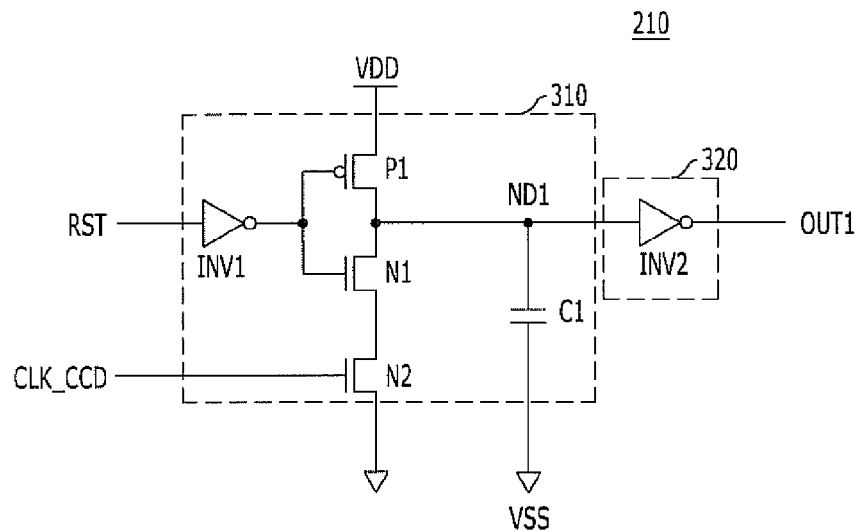
FIG. 3 is a circuit diagram illustrating a first pulse detection circuit 210 shown in FIG. 2.

FIG. 3 is a circuit diagram illustrating the first pulse detection circuit 210 shown in FIG. 2. The second pulse detection circuit 220 may have a similar structure to that of the first pulse detection circuit 210. The second pulse detection circuit 220 may be different from the first pulse detection circuit 210 in receiving the inverted signal /CLK_CCD instead of the corrected clock signal CLK_CCD to generate the second output signal OUT2.

Referring to FIG. 3, the first pulse detection circuit 210 includes a discharge block 310 and an output block 320.

The discharge block 310 discharges pre-charged charges out of a first capacitor C1 in response to a logic high duration of the corrected clock signal CLK_CCD, and it includes a first inverter INV1, a first PMOS transistor P1, a first NMOS transistor N1, a second NMOS transistor N2, and the first capacitor C1. The output block 320 enables the first output signal OUT1 to a logic high level in response to a discharge amount of the first capacitor C1, and it includes a second inverter INV2.

The first pulse detection circuit 210 and the second pulse detection circuit 220 perform a pre-charge operation in response to a reset signal RST. The operations of the first and second pulse detection circuits 210 and 220 including the pre-charge operation will be described again by referring to FIG. 5. The enabling moment of the first output signal OUT1 generated in the first pulse detection circuit 210 is decided in response to a duration where the corrected clock signal CLK_CCD maintains a logic high level, and the enabling moment of the second output signal OUT2 generated in the second pulse detection circuit 220 is decided in response to a duration where the inverted signal /CLK_CCD maintains a logic high level, that is, a duration where the corrected clock signal CLK_CCD maintains a logic low level.

Figure 4:
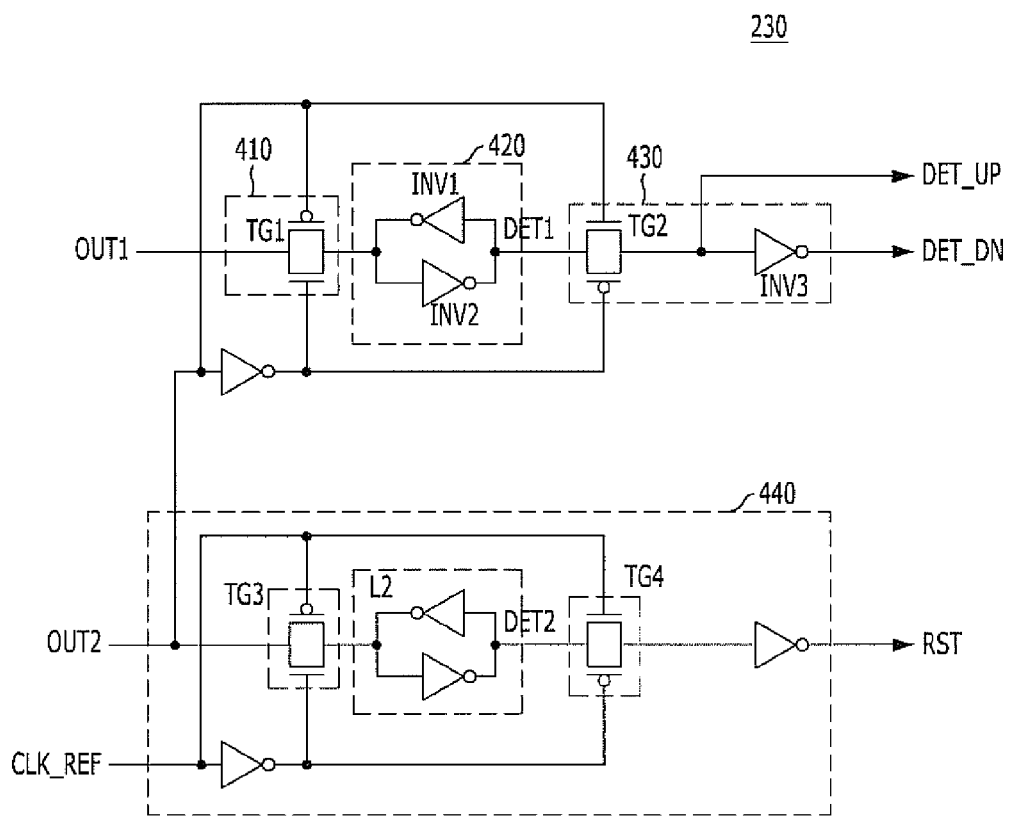
FIG. 4 is a circuit diagram illustrating a detection signal output circuit 230 shown in FIG. 2.

FIG. 4 is a circuit diagram illustrating the detection signal output circuit 230 shown in FIG. 2.

Referring to FIG. 4, the detection signal output circuit 230 includes an input block 410 for receiving the first output signal OUT1 in response to the second output signal OUT2, a latching block 420 for latching a signal transferred through the input block 410, and an output block 430 outputs output signals of the latching clock 420 as the up-detection signal DET_UP and the down detection signal DET_DN in response to the second output signal OUT2. Here, the input block 410 may be formed as a first transfer gate TG1 including a pair of a PMOS transistor and an NMOS transistor. The latching block 420 may include a first inverter INV1 and a second inverter INV2, and the output block 430 may include a second transfer gate TG2 outputting the up-detection signal DET_UP and a third inverter INV3 outputting the down detection signal DET_DN.

Meanwhile, the detection signal output circuit 230 in the present embodiment may further include a reset signal generation block 440 for generating the reset signal RST in response to a reference clock signal CLK_REF. The reset signal RST is a signal enabled after the second output signal OUT2 is enabled, and it is synchronized with the reference clock signal CLK_REF having a predetermined frequency and then outputted.

Figure 5:
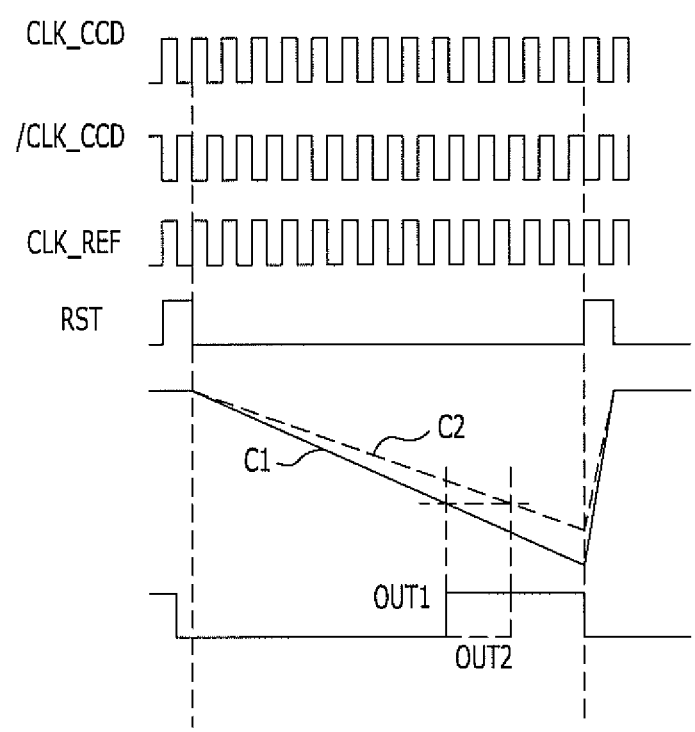
FIG. 5 is a timing diagram illustrating the operation of circuits shown in FIGS. 2 to 4.

FIG. 5 is a timing diagram illustrating the operation of circuits shown in FIGS. 2 to 4.

Referring to FIGS. 2 to 5, an input clock signal CLK_IN is inputted to the duty cycle control unit 110. Since the input clock signal CLK_IN goes through no correction operation before a duty cycle correction operation, the duty cycle control unit 110 outputs a corrected clock signal CLK_CCD which is almost the same as the input clock signal CLK_IN.

Meanwhile, the first PMOS transistor P1 (see FIG. 3) of the first pulse detection circuit 210 is turned on and the first capacitor C1 is charged in a duration where the reset signal RST is in a logic high level. In other words, the first pulse detection circuit 210 performs a pre-charge operation in a duration where the reset signal RST is in a logic high level, and drives a voltage of a first node ND1 to a logic high level to output the first output signal OUT1 in a logic low level. The second pulse detection circuit 220 also performs a pre-charge operation in response to the reset signal RST, just as the first pulse detection circuit 210 does, and outputs the second output signal OUT2 in a logic low level.

Hereafter, for the sake of convenience in description, a case where the logic high duration of the corrected clock signal CLK_CCD is longer than a logic low duration is taken as an example.

The first pulse detection circuit 210 receives the corrected clock signal CLK_CCD, and the second pulse detection circuit 220 receives the inverted signal /CLK_CCD. As shown in FIG. 3, the second NMOS transistor N2 of the first pulse detection circuit 210 is turned on in response to a logic high duration of the corrected clock signal CLK_CCD. Since the first NMOS transistor N1 is turned on after the reset signal RST is disabled, the charges in the first capacitor C1 are discharged in response to the logic high duration. FIG. 5 illustrates the discharge amount of the first capacitor C1 and a second capacitor C2, and the second capacitor C2 has a structure corresponding to the second pulse detection circuit 220.

Meanwhile, since the logic high duration of the inverted signal /CLK_CCD is shorter than a duration where the corrected clock signal CLK_CCD is in a logic high level, the discharge amount of the first capacitor C1 becomes greater than the discharge amount of the second capacitor C2. In short, the voltage level of the first node ND1 corresponding to the first pulse detection circuit 210 decreases more quickly than the voltage level of a second node (not shown) corresponding to the second pulse detection circuit 220. Subsequently, the first output signal OUT1 and the second output signal OUT2 transition to logic high levels in response to the voltage levels of the first node ND1 and the second node, respectively. Since the voltage level of the first node ND1 decreases more quickly than the voltage level of the second node, the first output signal OUT1 transitions to a logic high level earlier than the second output signal OUT2. In other words, the enabling moment of the first output signal OUT1 is decided in response to the logic high duration of the corrected clock signal CLK_CCD, and the enabling moment of the second output signal OUT2 is decided in response to the logic high duration of the inverted signal /CLK_CCD, that is, the logic low duration of the corrected clock signal CLK_CCD.

Subsequently, the generated first output signal OUT1 and second output signal OUT2 are inputted to the detection signal output circuit 230 (see FIG. 4). Since a case where the first output signal OUT1 transitions earlier than the second output signal OUT2 is taken as an example, the circuit operation of FIG. 4 is described hereafter based on the case.

In the first place, when the first output signal OUT1 is of a logic high level and the second output signal OUT2 is of a logic low level, the first transfer gate TG1 receives the first output signal OUT1 and transfers it to the latching block 420. The latching block 420 latches the logic high level of the first output signal OUT1. Subsequently, when the second output signal OUT2 transitions to a logic high level, the second transfer gate TG2 is turned on to output the up-detection signal DET_UP of a logic low level and the down detection signal DET_DN of a logic high level. Here, the down detection signal DET_DN being in the logic high level represents a result value for a case where the duty cycle of the corrected clock signal CLK_CCD is greater than 50%.

Conversely, when the logic low duration of the corrected clock signal CLK_CCD is longer than a logic high duration, the up-detection signal DET_UP is of a logic high level while the down detection signal DET_DN is of a logic low level. Here, the up-detection signal DET_UP being in the logic high level represents a result value for a case where the duty cycle of the corrected clock signal CLK_CCD is smaller than 50%.

The duty cycle detection unit 120 in accordance with the present embodiment sequentially detects a logic high duration and a logic low duration of the corrected clock signal CLK_CCD, outputs the first output signal OUT1 and the second output signal OUT2, and, after the second output signal OUT2 is enabled, outputs the up-detection signal DET_UP and the down detection signal DET_DN regardless of whether the first output signal OUT1 is enabled or not. In other words, when a cycle of the corrected clock signal CLK_CCD includes a logic high level duration and a logic low level duration, the up-detection signal DET_UP and the down detection signal DET_DN corresponding to the duty cycle of the corrected clock signal CLK_CCD are outputted in response to the logic low duration of the corrected clock signal CLK_CCD.

Through the operation, the duty cycle detection unit 120 may generate the up-detection signal DET_UP and the down detection signal DET_DN corresponding to the same number of pulses. To be specific, the first pulse detection circuit 210 and the second pulse detection circuit 220 respectively performs a discharge operation in response to the logic high durations of the corrected clock signal CLK_CCD and the logic low durations of the corrected clock signal CLK_CCD of the same number as the logic high durations, and the detection signal output circuit 230 generates the up-detection signal DET_UP and the down detection signal DET_DN accordingly. That is, the duty cycle detection unit 120 may perform an accurate operation to detect the duty cycle of the corrected clock signal CLK_CCD.

Meanwhile, the reset signal generation block 440 (see FIG. 4) synchronizes the second output signal OUT2 with the reference clock signal CLK_REF and outputs a synchronized second output signal OUT2 as the reset signal RST. In other words, after the second output signal OUT2 is enabled to a logic high level, the reset signal RST is enabled to a logic high level in response to the reference clock signal CLK_REF. The first pulse detection circuit 210 and the second pulse detection circuit 220 performs a pre-charge operation onto a corresponding node, e.g., the first node ND1 of the first pulse detection circuit 210, in response to the reset signal RST.

Figure 6:
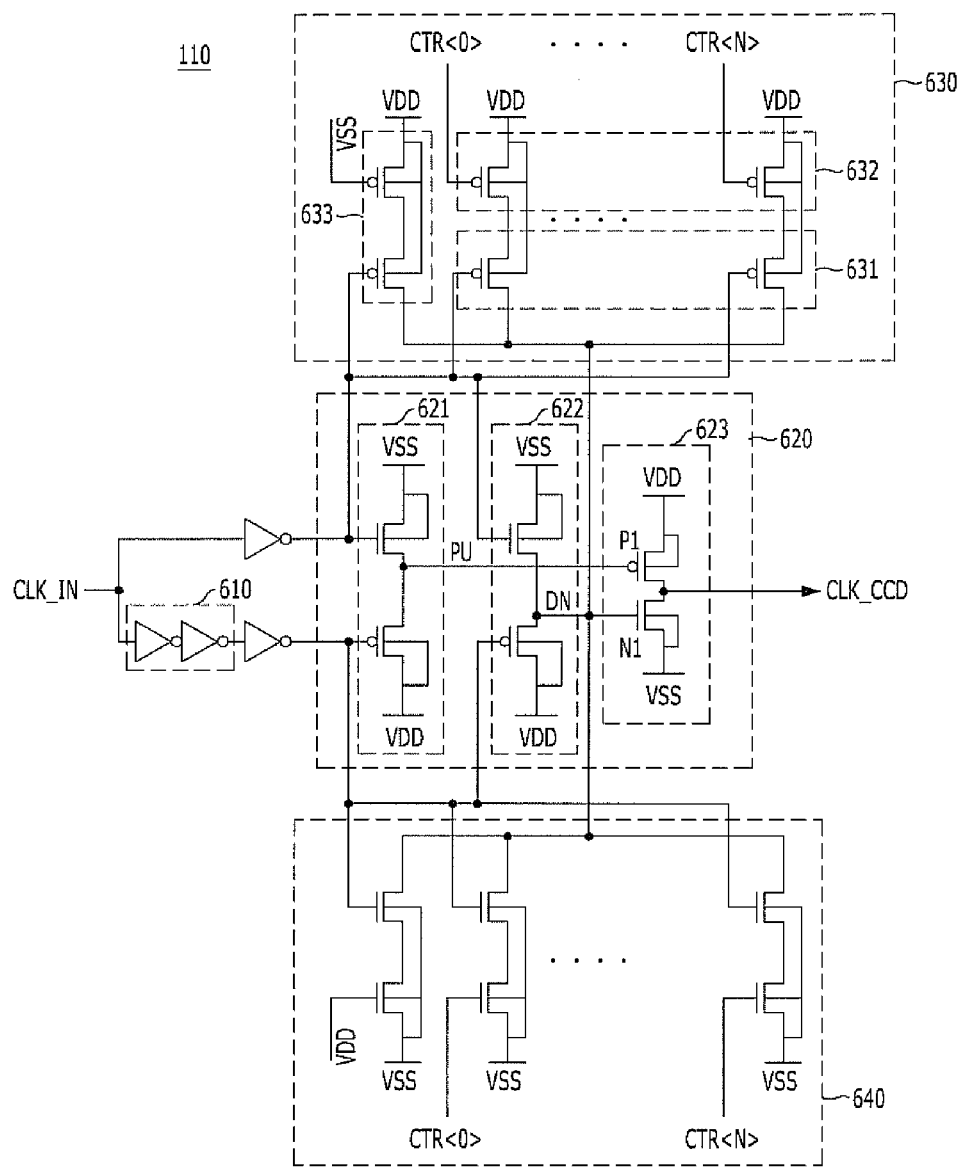
FIG. 6 is a circuit diagram illustrating a duty cycle control unit 110 shown in FIG. 1.

FIG. 6 is a circuit diagram illustrating the duty cycle control unit 110 shown in FIG. 1. For the sake of convenience in description, a control signal CTR generated in a control signal generation unit 130 is defined as a code-type signal, and it is given a drawing reference symbol CTR<0:N>.

Referring to FIG. 6, the duty cycle control unit 110 includes a delay circuit 610, a clock signal output circuit 620, and control circuits 630 and 640.

The delay circuit 610 delays the input clock signal CLK_IN by a predetermined time and outputs a delayed signal, and the delay circuit 610 includes a plurality of inverters. The delay time of the delay circuit 610 corresponds to a time taken for mixing the input clock signal CLK_IN and an output clock signal of the delay circuit 610 in the control circuits 630 and 640.

The clock signal output circuit 620 outputs the corrected clock signal CLK_CCD in response to the input clock signal CLK_IN and the output clock signal of the delay circuit 610, and the clock signal output circuit 620 includes a pull-up drive control block 621, a pull-down drive control block 622, and a driving block 623.

Here, the pull-up drive control block 621 generates a pull-up drive signal PU in response to the input clock signal CLK_IN and the output clock signal of the delay circuit 610, and the pull-down drive control block 622 generates a pull-down drive signal DN in response to the input clock signal CLK_IN and the output clock signal of the delay circuit 610.

Subsequently, the driving block 623 outputs the corrected clock signal CLK_CCD in response to the pull-up drive signal PU and the pull-down drive signal DN, and the driving block 623 includes a first PMOS transistor P1 and a first NMOS transistor N1. Here, the first PMOS transistor P1 is a pull-up driver for pull-up driving an output terminal of the corrected clock signal CLK_CCD in response to the pull-up drive signal PU, and the first NMOS transistor N1 is a pull-down driver for pull-down driving the output terminal in response to the pull-down drive signal DN.

Meanwhile, the control circuits 630 and 640 control the transition timing of the corrected clock signal CLK_CCD in response to the control signal CTR<0:N>. In the embodiment of the present invention, a case where the control circuits 630 and 640 are coupled with the output terminal of the pull-down drive control block 622 is taken as an example. The control circuits 630 and 640 may be coupled with the output terminal of the pull-up drive control block 621 as well according to another embodiment of the present invention.

The control circuits 630 and 640 include a first driving force providing circuit 630 and a second driving force providing circuit 640. The first driving force providing circuit 630 provides the output terminal of the pull-down drive control block 622 with a driving force corresponding to the control signal CTR<0:N> in response to the input clock signal CLK_IN, and the second driving force providing circuit 640 provides the output terminal with a driving force corresponding to the control signal CTR<0:N> in response to the output clock signal of the delay circuit 610.

Here, the first driving force providing circuit 630 includes a path forming block 631 and a transfer block 632. The path forming block 631 forms a current path coupling the transfer block 632 with the output terminal of the pull-down drive control block 622 in response to the input clock signal CLK_IN. The transfer block 632 transfers a supplied power source voltage VDD to the path forming block 631 in response to the control signal CTR<0:N>. Therefore, the path forming block 631 performs a turn on/off operation in response to the input clock signal CLK_IN, and the transfer block 632 have different number of paths for supplying the supplied power source voltage VDD based on the control signal CTR<0:N>. In other words, the output terminal of the pull-down drive control block 622 is driven by a driving force corresponding to the control signal CTR<0:N>. The first driving force providing circuit 630 further includes a reference driving force providing block 633 for providing the output terminal of the pull-down drive control block 622 with a reference driving force in response to the input clock signal CLK_IN.

Meanwhile, the second driving force providing circuit 640 has a similar symmetrical structure to that of the first driving force providing circuit 630. The second driving force providing circuit 640 is different from the first driving force providing circuit 630 in operating based on the output clock signal of the delay circuit 610 instead of the input clock signal CLK_IN and providing a ground power source voltage VSS instead of the supplied power source voltage VDD.

Hereafter, a circuit operation of the duty cycle control unit 110 shown in FIG. 6 is described briefly. In this embodiment, the duty cycle of the corrected clock signal CLK_CCD is controlled by controlling its falling edge based on the control signal CTR<0:N> in response to a rising edge of the input clock signal CLK_IN.

First of all, when the input clock signal CLK_IN transitions from a logic high level to a logic low level, the pull-up drive control block 621 generates the pull-up drive signal PU of a logic low level and the pull-down drive control block 622 generates the pull-down drive signal DN of a logic low level. Therefore, the first PMOS transistor P1 of the driving block 623 is turned on, and the corrected clock signal CLK_CCD transitions from a logic low level to a logic high level. Here, since the corrected clock signal CLK_CCD is not influenced by a driving force based on the control signal CTR<0:N>, it may have the same phase.

Subsequently, when the input clock signal CLK_IN transitions from a logic low level to a logic high level, the path forming block 631 of the first driving force providing circuit 630 and a path forming block of the second driving force providing circuit 640 are turned on for a reflecting time in the delay circuit 610. Therefore, the output terminal of the pull-down drive control block 622 is supplied with a driving force corresponding to the control signal CTR<0:N>, and the transition timing of the corrected clock signal CLK_CCD is controlled based on the driving force. In other words, a slew rate corresponding to a falling edge of the corrected clock signal CLK_CCD is controlled.

This is described in detail hereafter. For the sake of convenience in description, it is assumed that the control signal CTR<0:N> is a four-bit code signal. When the control signal CTR<0:N> is a four-bit code signal, the number of MOS transistors included in each of the transfer blocks of the first driving force providing circuit 630 and the second driving force providing circuit 640 are four.

First of all, when the control signal is '0000', the transistors of the transfer block 632 of the first driving force providing circuit 630 are all turned on, and the transistors of the transfer block of the second driving force providing circuit 640 are all turned off. Therefore, the corrected clock signal CLK_CCD transitions from a logic high level to a logic low level most quickly in a duration corresponding to the delay time reflected in the delay circuit 610. On the other hand, when the control signal is '1111', the transistors of the transfer block 632 of the first driving force providing circuit 630 are all turned off, and the transistors of the transfer block of the second driving force providing circuit 640 are all turned on. Therefore, the corrected clock signal CLK_CCD transitions to a logic low level most slowly in a duration corresponding to the delay time reflected in the delay circuit 610.

In other words, as the control signal is changed in sequence as in '0000'→'0001'→'0011'→'0111'→'1111', a falling edge of the corrected clock signal CLK_CCD goes backward, and this circuit operation represents that the duty cycle of the corrected clock signal CLK_CCD is changed based on the control signal CTR<0:N>.

According to an embodiment of the present invention, since the duty cycle correction circuit has a simplified internal structure, the size of a semiconductor chip including the duty cycle correction circuit may be minimized, and the operation speed of the circuit may become fast. Moreover, the area occupied by the circuit and the current consumption amount of the duty cycle correction circuit may be minimized.

Also, the duty cycle correction circuit may acquire more accurate result value in detecting a duty cycle of a clock signal.

While the present invention has been described with respect to the specific embodiments, it will be apparent to those skilled in the art that various changes and modifications may be made without departing from the spirit and scope of the invention as defined in the following claims.

Although the duty cycle correction circuit in accordance with an embodiment of the present invention has been described by taking an example of a case where a falling edge of a corrected clock signal CLK_CCD is controlled, it may also control a rising edge of the corrected clock signal CLK_CCD through a simple modification of a circuit, for example, by adding an inverter to the output terminal through which the corrected clock signal CLK_CCD is outputted or by supplying a driving force to the output terminal of the pull-up drive control block 621.

In addition, the logic gates and transistors illustrated in the above-described embodiment may be realized differently in their position and kind according to the polarity of an input signal.

What is claimed is:

1. A duty cycle correction circuit, comprising:
   a duty cycle control unit configured to generate a corrected clock signal by correcting a duty cycle of an input clock signal in response to a control signal;
   a duty cycle detection unit configured to detect a duty cycle of the corrected clock signal and output a detection signal; and
   a control signal generation unit configured to generate the control signal in response to the detection signal,
   wherein the duty cycle control unit comprises:
      a delay circuit configured to delay the input clock signal by a delay time and output a delayed signal;
      a clock signal output circuit configured to output the corrected clock signal in response to the input clock signal and an output clock signal of the delay circuit; and
      a control circuit configured to control a transition timing of the corrected clock signal in response to the control signal,
      wherein the control circuit mixes the input clock signal with the output clock signal of the delay circuit for the delay time of the delay circuit.

2. The duty cycle correction circuit of claim 1, wherein the clock signal output circuit comprises:
   a driving block configured to output the corrected clock signal in response to first and second drive control signals; and
   first and second drive control blocks configured to generate the first and second drive control signals in response to the input clock signal and the output clock signal of the delay circuit.

3. The duty cycle correction circuit of claim 2, wherein the driving block comprises:
   a pull-up driver for pull-up driving an output terminal in response to the first drive control signal; and
   a pull-down driver for pull-down driving the output terminal in response to the second drive control signal.

4. The duty cycle correction circuit of claim 2, wherein the control circuit comprises:
   a first driving force providing circuit which is coupled with at least one output terminal of the first and second drive control blocks and provides the output terminal with a first driving force based on the control signal in response to the input clock signal; and
   a second driving force providing circuit configured to provide the output terminal with a second driving force based on the control signal in response to the output clock signal of the delay circuit.

5. The duty cycle correction circuit of claim 4, wherein each of the first driving force providing circuit and the second driving force providing circuit comprises:
   a path forming block for forming a current path coupled with the output terminal in response to the input clock signal or the output clock signal of the delay circuit; and
   a transfer block for providing the path forming block with the first driving force or the second diving force in response to the control signal.

6. The duty cycle correction circuit of claim 5, wherein the control signal includes a plurality of bits, the transfer block includes a number of transistors, and the number of transistors of the transfer block is the same as the number of the bits.

7. The duty cycle correction circuit of claim 6, wherein the control signal generation unit generates the plurality of codes through a counting operation in response to the detection signal.

8. The duty cycle correction circuit of claim 2, wherein the control circuit further comprises:
   a reference driving force providing block configured to provide at least one output terminal of the first and second drive control blocks with a reference driving force in response to the input clock signal and the output clock signal of the delay circuit.

9. The duty cycle correction circuit of claim 1, wherein a transition timing of the corrected clock signal is controlled during a duration corresponding to the delay time of the delay circuit.

10. The duty cycle correction circuit of claim 1, wherein the duty cycle detection unit comprises:
    a first pulse detection circuit configured to detect a first logic level of the corrected clock signal;
    a second pulse detection circuit configured to detect a second logic level of the corrected clock signal; and
    a detection signal output circuit configured to output the detection signal based on the duty cycle of the corrected clock signal after an output signal of the second pulse detection circuit is enabled.

11. The duty cycle correction circuit of claim 10, wherein an enabling timing of an output signal of the first pulse detection circuit is decided based on a duration where the corrected clock signal maintains the first logic level, and an enabling timing of the output signal of the second pulse detection circuit is decided based on a duration where the corrected clock signal maintains the second logic level.

12. A duty cycle detection circuit, comprising:
    a first pulse detection circuit configured to detect a first logic level of an input clock signal;
    a second pulse detection circuit configured to detect a second logic level of the input clock signal; and
    a detection signal output circuit configured to output a detection signal based on a duty cycle of the input clock signal after an output signal of the second pulse detection circuit is enabled,
    wherein an enabling timing of an output signal of the first pulse detection circuit is decided based on a duration where the input clock signal maintains the first logic level, and an enabling timing of the output signal of the second pulse detection circuit is decided based on a duration where the input clock signal maintains the second logic level.

13. The duty cycle detection circuit of claim 12, wherein each of the first pulse detection circuit and the second pulse detection circuit comprises:
    a discharge block configured to discharge pre-charged charges in response to a corresponding logic level of the input clock signal; and
    an output block configured to enable an output signal in response to a discharge amount of the discharge block.

14. The duty cycle detection circuit of claim 13, wherein the discharge amount of the discharge block is determined based on a duration wherein the input clock signal maintains the corresponding logic level.

15. The duty cycle detection circuit of claim 12, wherein the detection signal output circuit comprises:

an input block configured to receive an output signal of the first pulse detection circuit in response to the output signal of the second pulse detection circuit;

a latching block configured to latch a signal transferred through the input block; and an output block configured to output an output signal of the latching block as the detection signal in response to the output signal of the second pulse detection circuit.

16. The duty cycle detection circuit of claim 12, further comprising:

a reset signal generation block configured to generate a reset signal which is enabled after the output signal of the second pulse detection circuit is enabled.

17. The duty cycle detection circuit of claim 16, wherein each of the first pulse detection circuit and the second pulse detection circuit performs a pre-charge operation in response to the reset signal.

18. A duty cycle control circuit, comprising:

a delay circuit configured to delay an input clock signal by a delay time and output a delayed signal;

a clock signal output circuit configured to output a corrected clock signal in response to the input clock signal and an output clock signal of the delay circuit; and a control circuit configured to control a transition timing of the corrected clock signal in response to a control signal, wherein the control circuit mixes the input clock signal with the output clock signal of the delay circuit for the delay time of the delay circuit.

19. The duty cycle control circuit of claim 18, wherein the clock signal output circuit comprises:

a driving block configured to output the corrected clock signal in response to first and second drive control signals; and first and second drive control blocks configured to generate the first and second drive control signals in response to the input clock signal and the output clock signal of the delay circuit.

20. The duty cycle control circuit of claim 19, wherein the control circuit comprises:

a first driving force providing circuit which is coupled with at least one output terminal of the first and second drive control blocks and provides the output terminal with a first driving force based on the control signal in response to the input clock signal; and a second driving force providing circuit configured to provide the output terminal with a second driving force based on the control signal in response to the output clock signal of the delay circuit.

21. The duty cycle control circuit of claim 18, wherein the control signal is generated by detecting a duty cycle of the corrected clock signal and counting a detected result value.

22. A method for operating a duty cycle correction circuit, comprising:

sequentially detecting a first logic level and a second logic level of an input clock signal which form one cycle of the input clock signal; and detecting a duty cycle of the input clock signal in response to a second detection signal corresponding to the second logic level, wherein the detecting of the duty cycle of the input clock signal comprises:

receiving and latching a first detection signal corresponding to the first logic level in response to the second detection signal to produce a latched signal; and outputting the latched signal as a result value indicating the duty cycle of the input clock signal in response to the second detection signal.

23. The method of claim 22, wherein the result value is outputted after the second detection signal is enabled

* * * * *